(12) United States Patent
Drane

(10) Patent No.: US 10,296,293 B2
(45) Date of Patent: May 21, 2019

(54) LOW-AREA FIXED-POINT POLYNOMIALS

(71) Applicant: Imagination Technologies Limited, Kings Langley (GB)

(72) Inventor: Theo Alan Drane, London (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 15/633,851

(22) Filed: Jun. 27, 2017

(65) Prior Publication Data

US 2017/0371621 A1     Dec. 28, 2017

(30) Foreign Application Priority Data

Jun. 27, 2016    (GB) .................................. 1611157.7

(51) Int. Cl.
*G06F 17/50*    (2006.01)
*G06F 17/11*    (2006.01)
*G06F 7/50*     (2006.01)

(52) U.S. Cl.
CPC ............... *G06F 7/50* (2013.01); *G06F 17/11* (2013.01); *G06F 17/505* (2013.01); *G06F 17/5054* (2013.01)

(58) Field of Classification Search
CPC ...... G06F 17/5045–17/5054; G06F 2207/5356
See application file for complete search history.

(56) References Cited

U.S. PATENT DOCUMENTS

| | | | |
|---|---|---|---|
| 8,949,298 B1* | 2/2015 | Langhammer | G06F 7/552 |
| | | | 708/200 |
| 2004/0267681 A1 | 12/2004 | Savage | |
| 2011/0264990 A1 | 10/2011 | Sawada | |
| 2013/0007085 A1 | 1/2013 | Drane | |
| 2013/0346927 A1 | 12/2013 | Drane | |
| 2016/0097808 A1 | 4/2016 | Drane | |

OTHER PUBLICATIONS

Drane; "Lossy Polynomial Datapath Synthesis"; Feb. 1, 2014; Retrieved from the Internet: URL: https://spiral.imperial.ac.uk/bitstream/10044/1/15566/5/Drane-TA-2014-PhD-Thesis.pdf; pp. 1-378.

* cited by examiner

*Primary Examiner* — Matthew D Sandifer
(74) *Attorney, Agent, or Firm* — Vorys, Sater, Seymour and Pease LLP; Vincent M DeLuca

(57) ABSTRACT

Methods of implementing fixed-point polynomials in hardware logic include distributing a defined error bound for the whole polynomial between operators in a data-flow graph for the polynomial by solving an optimization problem that outputs an accuracy parameter and a precision parameter for each node. Each operator is then itself optimized to satisfy the part of the error bound allocated to that operator and as defined by the accuracy and precision parameters.

19 Claims, 12 Drawing Sheets

LOW-AREA FIXED-POINT POLYNOMIALS

BACKGROUND

As is known to those of skill in the art, a polynomial is a mathematical expression comprising one or more terms, each of which consists of a constant multiplied by one or more variables raised to a non-negative integer exponent (e.g. $a+bx+cx^2$, where a, b and c are the constants and x is the variable).

Polynomials are very common as they can be used to calculate a variety of values and/or model certain behavior. For example, a point $(a_1, a_2, a_3)$ 102 is determined to be on one side of a triangle 104 defined by three points $(0, 0, 0)$, $(b_1, b_2, b_3)$, and $(c_1, c_2, c_3)$ as shown in FIG. 1, diagram (a) if the equation below is true:

$$a_1 b_2 c_3 - a_1 b_3 c_2 - a_2 b_1 c_3 + a_2 b_3 c_1 + a_3 b_1 c_2 - a_3 b_2 c_1 \geq 0$$

In another example, a line passing through the point $(0,0,0)$ and $(v_1, v_2, v_3)$ 106 is determined to pass through a sphere 108 defined by a radius r and centre $(c_1, c_2, c_3)$, as shown in FIG. 1, diagram (b), if the equation below is true:

$$(v_1 c_1 + v_2 c_2 + v_3 c_3)^2 - (v_1^2 + v_2^2 + v_3^2)(c_1^2 + c_2^2 + c_3^2 - r^2) \geq 0$$

In further examples, polynomials may be used to implement filters, perform memory address calculations, perform binary to decimal conversion, etc. A variety of number and graphics formats have polynomial interpretations (e.g. floating-point formats, UNORM and SNORM graphics formats) and certain logical operations (e.g. inversion, XORing each bit of a with bit s) are also polynomial.

When a polynomial is evaluated in hardware it may be evaluated using fixed point or floating point number representations. As is known to those skilled in the art a fixed point number representation is a representation of a number that has a fixed number of digits after the radix point (e.g. decimal point or binary point). In contrast, a floating point number representation of a number is a representation of a number where the radix point is not fixed (i.e. it can "float"). In other words the radix point can be placed anywhere within the representation.

The embodiments described below are not limited to implementations which solve any or all of the disadvantages of known systems and method for implementing fixed-point polynomials.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods of implementing fixed-point polynomials in hardware logic are described. In an embodiment the method comprises distributing a defined error bound for the whole polynomial between operators in a data-flow graph for the polynomial by solving an optimization problem which outputs an accuracy parameter and a precision parameter for each node. Each operator is then itself optimized to satisfy the part of the error bound allocated to that operator and as defined by the accuracy and precision parameters.

A first aspect provides a method of generating an implementation of a fixed-point polynomial with rational coefficients in hardware logic that satisfies a defined error bound, the method comprising: receiving, in a synthesizer module, the polynomial as a data-flow graph comprising one or more nodes, wherein a node is either a sum-of-products operator or a constant division operator; computing, in the synthesizer module, a precision parameter and an accuracy parameter for each node in the data-flow graph based on the defined error bound for the polynomial by solving an optimization problem over all nodes; optimizing, in the synthesizer module, a single summation array for each node using a truncation scheme and an error bound for the node, wherein the error bound for the node is calculated using the precision parameter and the accuracy parameter for the node (306); and outputting, from the synthesizer module, a hardware representation of a binary logic circuit which implements the fixed-point polynomial, wherein the hardware representation is based on an optimized single summation array for each node.

A second aspect provides an apparatus configured to perform lossy synthesis of a fixed-point polynomial with rational coefficients and to generate an implementation of a fixed-point polynomial with rational coefficients in hardware logic that satisfies a defined error bound, the apparatus comprising: a processor; and a memory comprising computer executable instructions which, when executed, cause the processor to: receive the polynomial as a data-flow graph comprising one or more nodes, wherein a node is either a sum-of-products operator or a constant division operator; compute a precision parameter and an accuracy parameter for each node in the data-flow graph based on the defined error bound for the polynomial by solving an optimization problem over all nodes; optimize a single summation array for each node using a truncation scheme and an error bound for the node, wherein the error bound for the node is calculated using the precision parameter and the accuracy parameter for the node; and output a hardware representation of a binary logic circuit which implements the fixed-point polynomial, wherein the hardware representation is based on an optimized single summation array for each node.

The implementation of a fixed-point polynomial may be embodied in hardware on an integrated circuit. There may be provided a method of manufacturing, at an integrated circuit manufacturing system, an implementation of a fixed-point polynomial in hardware. There may be provided an integrated circuit definition dataset that, when processed in an integrated circuit manufacturing system, configures the system to manufacture an implementation of a fixed-point polynomial in hardware. There may be provided a non-transitory computer readable storage medium having stored thereon a computer readable description of an integrated circuit that, when processed, causes a layout processing system to generate a circuit layout description used in an integrated circuit manufacturing system to manufacture an implementation of a fixed-point polynomial in hardware.

There may be provided an integrated circuit manufacturing system comprising: a non-transitory computer readable storage medium having stored thereon a computer readable integrated circuit description that describes the implementation of a fixed-point polynomial in hardware; a layout processing system configured to process the integrated circuit description so as to generate a circuit layout description of an integrated circuit embodying the implementation of a fixed-point polynomial in hardware; and an integrated circuit generation system configured to manufacture the implementation of a fixed-point polynomial in hardware according to the circuit layout description.

There may be provided computer program code for performing a method as described herein. There may be provided non-transitory computer readable storage medium having stored thereon computer readable instructions that, when executed at a computer system, cause the computer system to perform the method as described herein.

The preferred features may be combined as appropriate, as would be apparent to a skilled person, and may be combined with any of the aspects of the invention.

BRIEF DESCRIPTION OF THE DRAWINGS

Embodiments of the invention will be described in detail with reference to the accompanying drawings in which.

Figure 1:
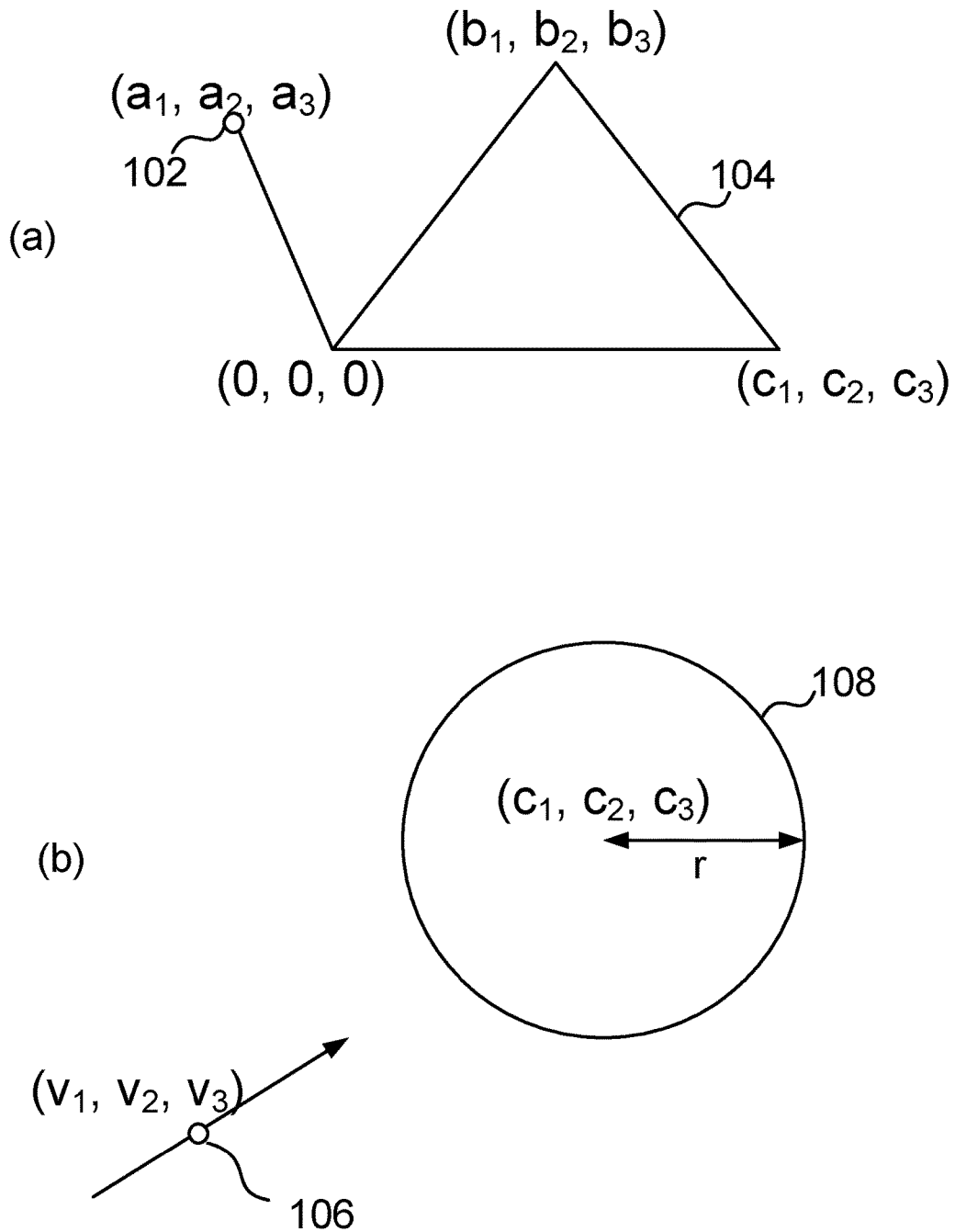
FIG. 1 shows a schematic diagram of a triangle defined by three three-dimensional points and a schematic diagram of a circle defined by a radius and a three-dimensional centre point.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Described herein are methods for implementing fixed-point polynomials in hardware logic which reduce resource usage (e.g. area of hardware logic that is required) whilst providing a guaranteed bounded error. In the methods described, the polynomials are not evaluated to infinite precision but instead the methods enable exploitation of a user defined maximum absolute error and so may be described as lossy. As described in detail below, the methods described herein perform an optimization to distribute the user defined maximum absolute error (which may also be referred to as the allowable error) between the operators in a data-flow graph (DFG) which represents the polynomial. The allocation of the allowable error to each of the operators is optimized to reduce/minimize implementation cost whilst guaranteeing that the user defined maximum absolute error is not exceeded. The allowable error for a node is defined in terms of two parameters—a first parameter, n, which relates to the precision of the result (e.g. as represented by the number of bits provided) and a second parameter, u, that relates to the accuracy of the result (i.e. how close the result is to the correct result).

The methods generate a hardware representation of the binary logic circuit logic (e.g. in the form of RTL, a higher level circuit representation such as Verilog™ or VHDL or a lower level representation such as OASIS or GDSII) that is guaranteed to meet the error specification and is suitable for datapath logic synthesis. Logic synthesis may then be used to transition from this hardware representation (e.g. RTL) to gate level to produce a gate level description which can then be laid out and implemented in silicon. In contrast to logic synthesis, the process of interpreting a system level model to produce a RTL description is referred to as high-level synthesis (HLS) and the methods described herein may be implemented in a high-level synthesizer.

By defining the allowable error for a node in terms of two parameters, one which relates to precision and the other which relates to accuracy, there are additional degrees of freedom when performing the optimization. The use of a precision parameter enables the optimization to take into consideration the bit widths between nodes and removes the needs for any iterative algorithm. Experimental results have shown that by using the methods described herein, the process of generating the hardware representation can be performed more quickly (e.g. providing a speed up of up to 32%) and result in an area reduction (of the resulting hardware logic) of around 39%. The resulting hardware logic may also have a reduced power consumption.

Filters typically require the implementation of fixed-point polynomials with rational coefficients. Such a polynomial can be represented as a data-flow graph (DFG) with nodes that are either arithmetic sum-of-products (SOPs) or constant division operators. The methods for generating a hardware representation of a fixed-point polynomial with rational coefficients described herein and the resulting hardware logic can be used in a fixed-point filter.

As described above, lossy synthesis is a method of synthesis (e.g. HLS) where the result is not bit identical to the input. In the methods described herein, the user specifies and controls the error and the lossy synthesizer exploits the error freedom to optimize hardware area, speed and/or power. Exploiting the error freedom comprises adjusting particular parameters within the circuits to be created. There are a number of approaches to lossy synthesis which have been proposed, including word-length optimization, imprecise operators and gate level imprecision. Word-level optimization involves choosing the precision for all internal variables whilst maintaining acceptable global (i.e. overall) error. The word-length (i.e. number of bits used to represent an internal variable) is dependent upon the range and precision of the data the variable must hold, as well as the number format. Choosing the best precision for all internal variables has, however, been shown to be NP-hard in general. Imprecise operators are operators (such as adders) which do not necessarily return the correct answer, but return an answer which is correct within a defined accuracy (e.g. rounded using a rounding scheme). Various imprecise adder and multiplier architectures have been proposed and some are described below; however determining how to use these imprecise components to optimize certain hardware properties while maintaining an acceptable level of total output error for an entire polynomial is complex. Gate level imprecision involves removing logic gates from a circuit whilst still maintaining some level of quality of the result.

Figure 2:
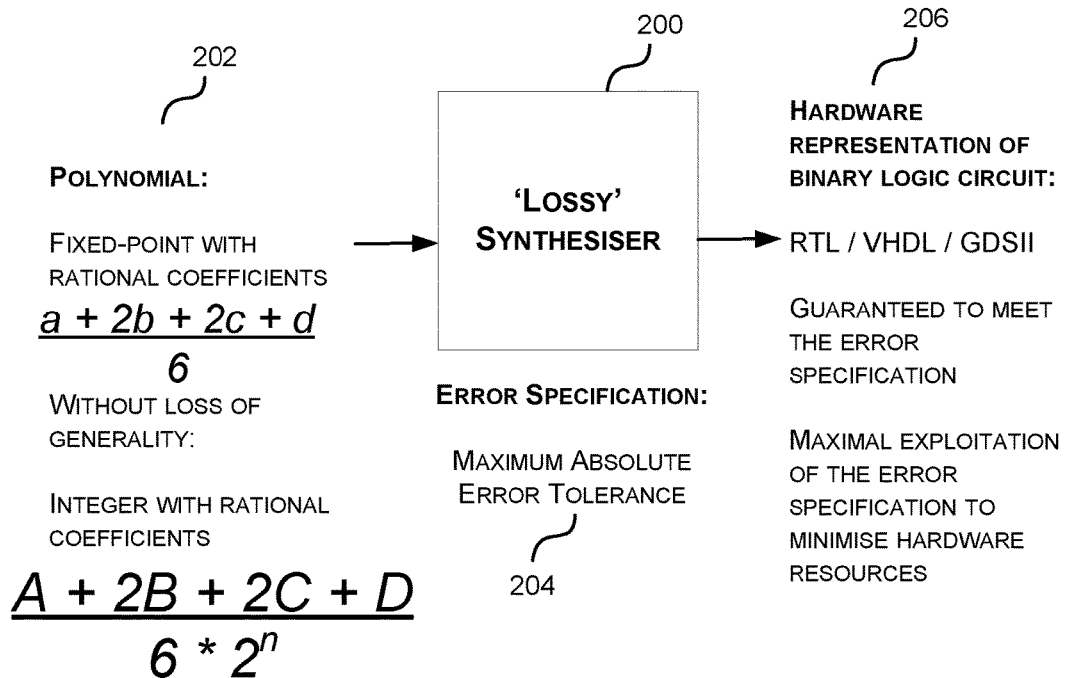
FIG. 2 is a schematic diagram of a lossy synthesizer.

The methods described herein are implemented in a lossy synthesizer 200 of the form shown in FIG. 2. This lossy synthesizer 200 takes as input 202 a polynomial with rational coefficients and fixed-point inputs and outputs. An error specification 204 is also provided which provides a user bounded error (i.e. a maximum absolute error tolerance). The output 206 of the synthesizer 200 is a hardware representation of the binary logic circuit (e.g. Verilog, VHDL or GDSII) which implements the input polynomial and is guaranteed to meet the error specification 204 and is suitable for datapath logic synthesis. A typical user requirement is that the result should be correct to the unit in the last place and this can be translated into an absolute error bound.

Figure 3:
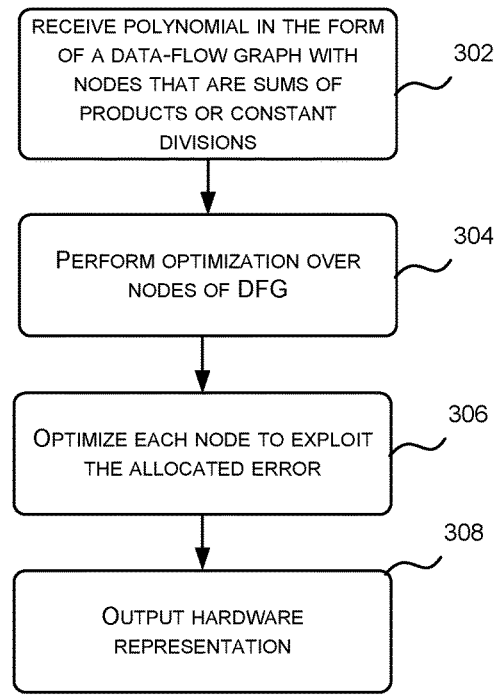
FIG. 3 is a flow diagram of an example method of operation of the lossy synthesizer shown in FIG. 2.

FIG. 3 is a flow diagram of an example method of operation of the lossy synthesizer 200. As described above, an input 202 to the lossy synthesizer is a fixed-point polynomial, p, with rational coefficients, for example:

$$p = \frac{a + 2b + 2c + d}{6}$$

Without loss of generality, the polynomial may be written as a polynomial with integer inputs and rational coefficients, for example of the following form for an appropriate value of n:

$$p = \frac{A + 2B + 2C + D}{6 * 2^n}$$

Figure 4:
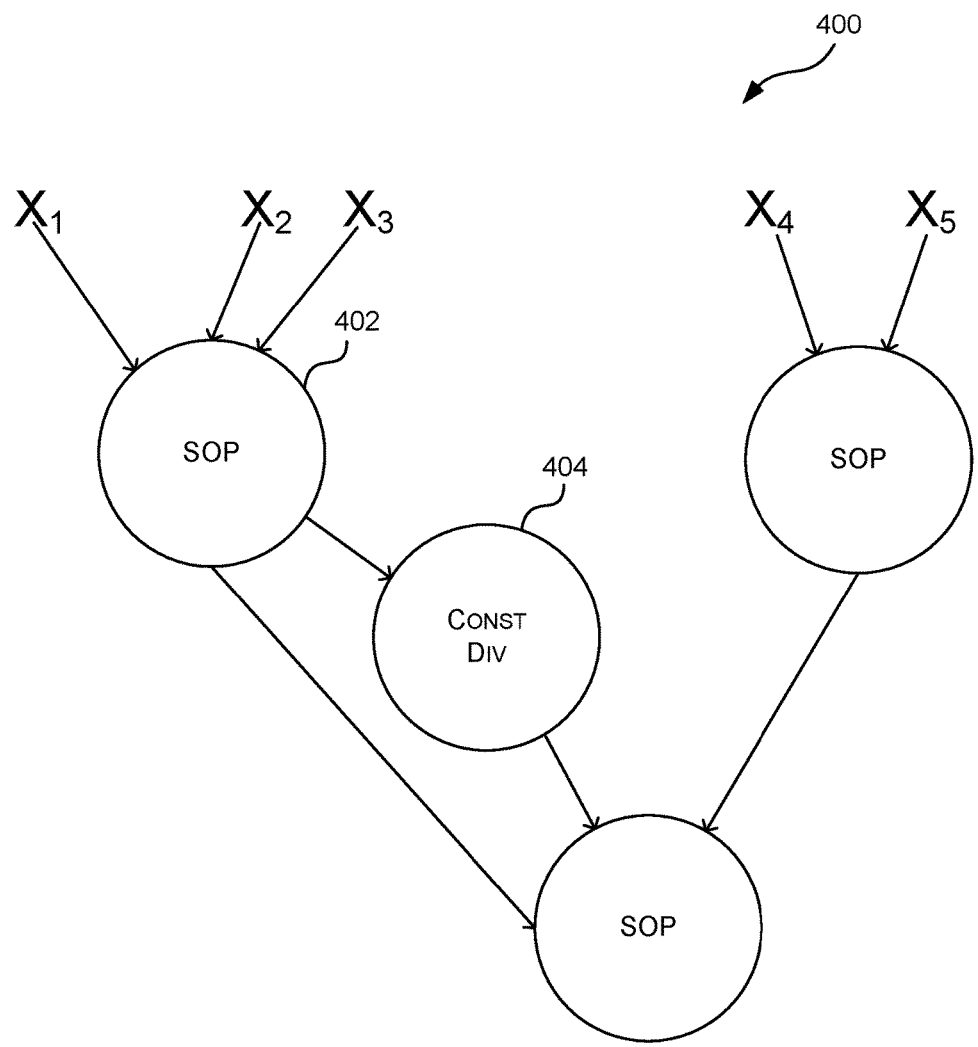
FIG. 4 shows an example data-flow graph.

As shown in FIG. 3, the polynomial, p, that is input to the lossy synthesizer 200, is represented as a DFG 400, as shown in FIG. 4, with nodes that are either arithmetic sum-of-products (SOPs) 402 or constant division operators 404 (block 302). In the following description the terms 'node' and 'operator' are used interchangeably when referring to the DFG. Assuming that the input polynomial is written in a form that has integer inputs, then there are a myriad of ways that the polynomial can be written in terms of integer SOPs and constant divisions. Moreover, such an expression can always be created (e.g. $x^3$ may instead be written as $x \times x^2$). The DFG which is received by the lossy synthesizer (in block 302) may comprise operators which are all SOP operators or all constant division operators or may comprise a combination of one or more SOP operators and one or more constant division operators.

An SOP has the form:

AB±CD±E . . .

and includes multipliers, squarers (e.g. $x^2$), constant multipliers and sets of additions. A constant division has the form:

x/d where d is a constant. It has been shown that this division can be replaced by a single multiply-add instruction:

$$x/d \approx \lfloor (ax+b)/2^k \rfloor \quad (1)$$

for suitable values of a, b and k. Alternatively, a constant division may be expressed as:

$$\frac{x}{d} = \frac{1}{2^r} \frac{ax}{2^s - 1} = \frac{1}{2^r} ax(2^{-s} + 2^{-2s} + 2^{-3s} + \ldots) \quad (2)$$

for some integers, r, a and s.

Having received the polynomial in the form of a DFG (in block 302), the task of the lossy synthesizer is to determine how to best distribute the allowed error 204 amongst the nodes (i.e. amongst the SOPs 402 and constant division operators 404). Each of the constant division operators 404 will introduce an error and each of the SOPs 402 may introduce an error and it is the cumulative effect of these individual operator errors which must not exceed the specified allowed error 204. In the method described herein, the goal is to remove the greatest number of partial product bits as ultimately the number and configuration of the partial products determines the characteristics of the cost of implementation of the polynomial. This is implemented using an optimizer to solve an optimization problem over all the DFG nodes (block 304). This optimization operation (in block 304) outputs a pair of values, $u_i$ and $n_i$, for each node i in the DFG (or outputs parameters from which this pair of values can be determined). The value $u_i$ may be referred to as an accuracy parameter for the node i and the value $n_i$ may be referred to as a precision parameter for the node i. Using these parameters, which together specify a part of the allowed error 204 for the entire polynomial implementation which is allocated to the node, $e_i$, each node is then optimized to exploit the allocated error (block 306). The resultant hardware representation, which implements the optimized nodes, is then output (block 308).

In the method described herein, the error which is allocated to each node i (in the optimization performed in block 304) are defined by the accuracy and precision parameters, $u_i$ and $n_i$, where the $u_i$ are real numbers greater than 0.5 and the $n_i$ are integers (and may be positive or negative):

$$e_i = u_i 2^{n_i} \quad (3)$$

By defining the error in terms of these two parameters, precision and accuracy can both be varied and the internal bit widths between nodes in the DFG are considered, i.e. the maximal output bit width from node i is:

$$2^{n_i}$$

As a value $n_i$ becomes more positive, the result is less precise and as a value $u_i$ becomes more positive, the result is less accurate (e.g. an acceptable error of up to 0.9 is less accurate than an error of up to 0.6). Consequently, using a low (i.e. more negative) value of $u_i$ and a low (i.e. less positive/more negative) value of $n_i$ results in a more precise and more accurate result and using a high value of $u_i$ and a high value of $n_i$ results in a less precise and less accurate result.

The optimization problem which is solved (in block 304) using an optimizer (such as any general global optimization solver, e.g. YALMIP) is:

$$\min \Sigma_i P_i(k_i) \quad (4)$$

subject to:

$$\Delta_i(k_i) \leq (2u_i - 1) 2^{n_i} \text{ for all } i$$

$$e_i = u_i 2^{n_i} \text{ for all } i$$

$$\Sigma_\alpha \lambda_\alpha e^\alpha \leq \eta \quad (5)$$

where:

$P_i(k_i)$ is a function of the partial product count after truncation;

η is the maximum absolute error tolerance 204;

$$\lambda_\alpha = \max_x |c_\alpha(x)| \qquad (6)$$

$c_\alpha(x)$ is a polynomial in x;
$e^\alpha = e_1^{\alpha_1} e_2^{\alpha_2} e_3^{\alpha_3}$ is the error bound associated with that term which may be formed from one or more of the absolute maximum errors (or error bounds) for each node in the DFG ($e_1$, $e_2$, $e_3$ in this example); and
α is a vector of integers.

The optimization problem as set out above (in equation (4) and its associated constraints), provides a smooth exploration space and this reduces the likelihood that the optimization settles on a local minima, rather than the global minimum. Furthermore, by phrasing the optimization problem as in equation (4), more complex problems can be more easily solved.

In the optimization algorithm (equation (4) above), $P_i(k_i)$ and $\Delta_i(k_i)$ are functions of the internal bit widths $m_i$ and may be referred to as the area cost heuristics for a node i and these are described in more detail below. As noted above, the parameter $P_i(k_i)$ is a function of the partial product count after truncation and may, for example, correspond to the number of bits that remain in the summation array for the node i after truncation. In other examples, $P_i(k_i)$ may, for example, be the array height or array width or another parameter which includes knowledge (or an evaluation) of the array shape, rather than only the number of partial products within the array. In various examples, $P_i(k_i)$ may, for example, be based, at least in part, on the bit width of intermediate signals. The form of $P_i(k_i)$ may be different for different SOPs. The parameter $\Delta_i(k_i)$ corresponds to the maximal value of the truncated section in the summation array for the node i (and does not vary for different SOPs). The parameter $k_i$ is a proxy for the parameters $u_i$ and $n_i$ and relates to the number of columns which are truncated when implementing the nodes in the DFG (although its precise definition differs depending upon whether the node is a SOP or a constant division operation and may be different for different SOPs).

The optimization problem as set out above (in equation (4) and its associated constraints) is based on the nodes in the DFG and does not consider the configuration of those nodes. In order to include some configuration of the nodes in the DFG, the $P_i(k_i)$ may not be summed (as in equation (4)) but may be combined in another way.

In order to perform the optimization (in block 304) using the optimization problem as specified by equation (4) above, the values of the area cost heuristics ($P_i(k_i)$ and $\Delta_i(k_i)$) for each node i are determined.

Figure 5:
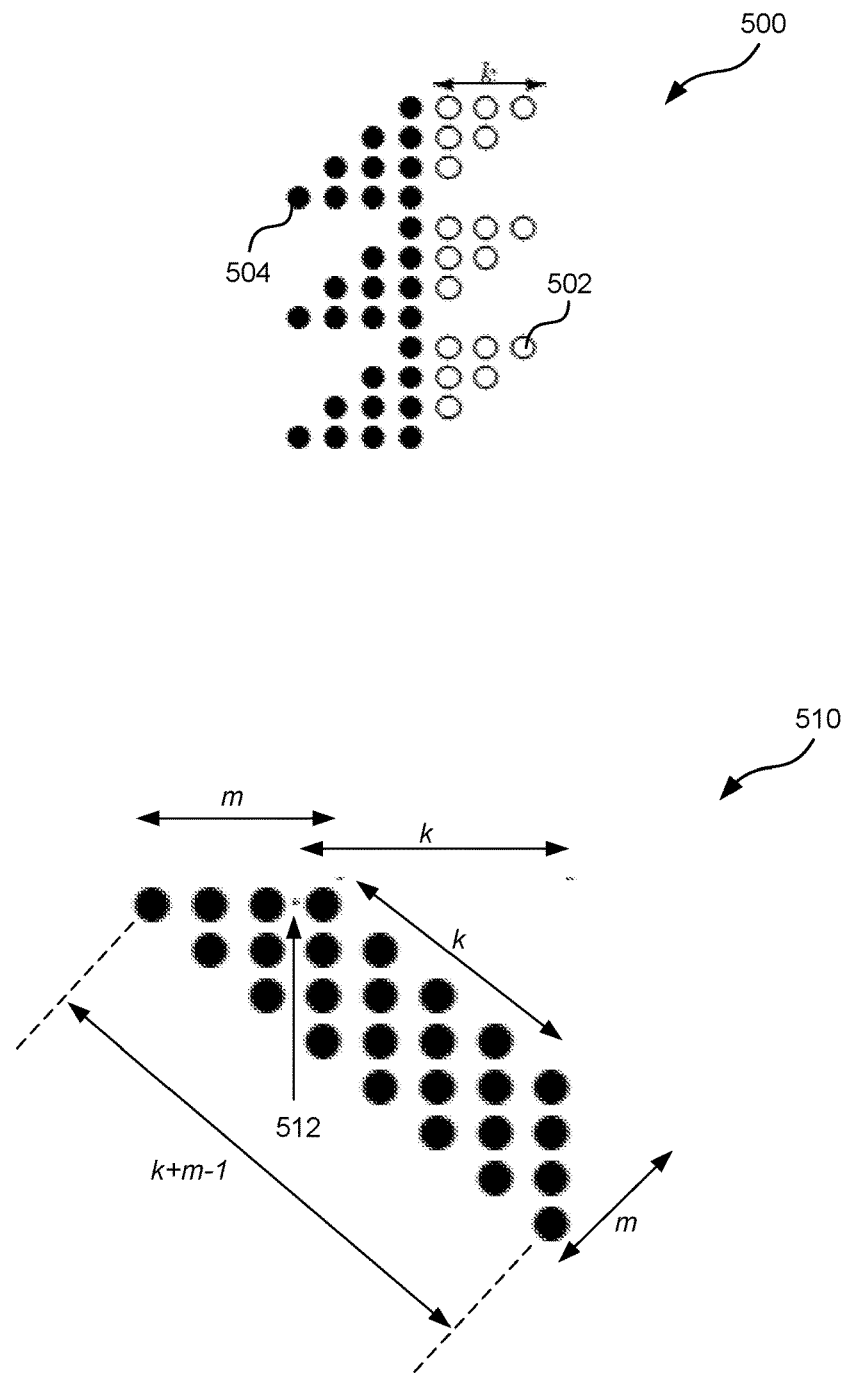
FIG. 5 shows truncated arrays for both a SOP node and a constant division node.

FIG. 5 shows an example summation array 500 for a SOP node with each circle representing a bit in the summation array. When creating a summation array for a lossy SOP operator, some of the bits in the array are not created (and hence may be described as being discarded). In the example shown in FIG. 5, the empty circles 502 represent bits that are discarded when the array is truncated and the solid circles 504 represent bits that are retained. The retained bits 504 are summed along with a constant C and then the results least significant N bits are then discarded (where N is related to the binary weight of the columns of the array and $n_i$).

As shown in FIG. 5, the k least significant columns are truncated and if there were M, m by m products (where in the example shown in FIG. 5, m=4 and M=3) it can be seen that for each group of m by m products, a triangle of bits is removed which comprises a number of bits given by:

$$\tfrac{1}{2}k(k+1) \qquad (7)$$

and so the total number of bits which remain in the array (after truncation) is given (assuming k≤m) by:

$$P(k) = M(m^2 - \tfrac{1}{2}k(k+1)) \qquad (8)$$

The maximal value of the truncated section is:

$$\Delta(k) = M\Sigma_{j=0}^{k-1}(j+1)2^j = M((k-1)2^k + 1) \qquad (9)$$

The equations (8) and (9) for P(k) and Δ(k) relate to the SOP with the summation array 500 shown in FIG. 5.

As noted above, different SOPs will have different forms of summation arrays and hence different equations for P(k) and Δ(k). For example, for a SOP of the form a×b+c where the inputs are m bits in length:

$$P(k) = m^2 + m - \tfrac{1}{2}k(k+1) - k$$

FIG. 5 also shows an example summation array 510 for a constant division; however, the array 510 is shown after truncation (i.e. so that there are no empty circles, representing bits that are discarded, shown in the diagram). In this example, equation (2) above is used to represent the constant division node and in the example shown in FIG. 5, x=x/2+x/2²+x/2³+... for an M bit input x. For a constant division node, the parameter k does not correspond to the number of columns which are truncated (the full array is infinite and so this would also be an infinite value) but instead corresponds to the number of fractional columns (i.e. the number of columns after the radix point 512) which are retained (this may also be described as truncating to k fractional columns).

The truncated array 510 as shown in FIG. 5 is a trapezium shape with a height m, with a base of length m+k−1 and a top of length k and so the total number of bits which remain in the array (after truncation) is given by:

$$\frac{m(m+2k-1)}{2} \qquad (10)$$

However, in a truncated constant division array for x/d only a 1/d fraction of these bits will be present and hence:

$$P(k) = \frac{m(m+2k-1)}{2d} \qquad (11)$$

As every truncated column in the array will have approximately m/d bits in it, the maximal value of the truncated section is:

$$\Delta(k) \approx \frac{m}{d}(2^{-k-1} + 2^{-k-2} + \ldots) = \frac{m}{d2^k} \qquad (12)$$

The condition given by equation (5) above can be derived as follows. If $\hat{p}(x,\varepsilon)$ is the actual value of the implementation of polynomial p(x) which introduces an actual error $\varepsilon_i$ at node i (so $|\varepsilon_i| \le e_i$), then the absolute error requirement is, for a user defined bound (i.e. maximum absolute error tolerance) η:

$$|p(x) - \hat{p}(x,\varepsilon)| \le \eta$$

Expanding the left hand side with respect to ε means that for some coefficients c(x) this condition can be written as follows:

$$\left|\sum_\alpha c_\alpha(x)\varepsilon^\alpha\right| \leq \eta$$

where $c_\alpha(x)$ are particular polynomials in x and $\varepsilon^\alpha = \varepsilon_1^{\alpha_1}\varepsilon_2^{\alpha_2}\ldots$ and so the summation is performed over the various values of vector elements of $\alpha$.

A bound on the left hand side is:

$$\left|\sum_\alpha c_\alpha(x)\varepsilon^\alpha\right| \leq \sum_\alpha \left(\max_x |c_\alpha(x)|\right) e^\alpha$$

where $e^\alpha$ is the vector of allocated error limits for each node. For example, if:

$$p(x) = x^2 y^2$$

and $$p(x, e) = (x^2 + e_1)(y^2 + e_2) + e_3$$

then $$p(x) - p(x,e) = x^2y^2 - (x^2+e_1)(y^2+e_2) - e_3 = -x^2 e_2 - y^2 e_1 - e_1 e_2 - e_3 =$$
$$x(-x^2)e_1^0 e_2^1 e_3^0 + (-y^2)e_1^1 e_2^0 e_3^0 + (-1)e_1^1 e_2^1 e_3^0 + (-1)e_1^0 e_2^0 e_3^1$$

It can be seen that each term is of the form:

$$c_{\alpha_1,\alpha_2,\alpha_3}(x)e_1^{\alpha_1}e_2^{\alpha_2}e_3^{\alpha_3}$$

which can be written as:

$$c_\alpha(x)e^\alpha$$

so $c_\alpha(x)$ is a polynomial in x and a term in $p(x)-p(x,e)$ and $e^\alpha = e_1^{\alpha_1}e_2^{\alpha_2}e_3^{\alpha_3}$ is the error bound associated with that term which may be formed from one or more of the absolute maximum errors (or error bounds) for each node in the DFG ($e_1, e_2, e_3$ in this example) and $\alpha$ is a vector of integers.

So a sufficient, but potentially non necessary (i.e. potentially overly restrictive), condition for the scheme to meet the user defined absolute error requirement is:

$$\Sigma_\alpha \lambda_\alpha e^\alpha \leq \eta \quad (5)$$

where $\lambda_\alpha$ is defined as:

$$\lambda_\alpha = \max_x |c_\alpha(x)| \quad (6)$$

Having established values for the errors allocated to each node in the DFG (in block 304, e.g. using equation (4) and its associated constraints and equations (8), (9), (11) and (12)), each node i is optimized to exploit the allocated error $e_i$ (in block 306), i.e. using the values of $u_i$ and $n_i$ output by the optimization (in block 304).

For an SOP node, the node can be optimized by removing the least significant bits from the single summation array such that their maximum associated binary value (i.e. the maximum value of the truncated bits appropriately binary weighted) does not exceed:

$$(2u_i-1)2^{n_i} \quad (13)$$

The optimization may involve using standard reduction techniques such that internal products will not exist during the reduction. Any suitable truncation scheme may be used, where these truncation schemes use the principle that a faithfully rounded result can be achieved more efficiently (i.e. in less area of hardware logic) by removing some of the partial product bits (e.g. as described above) and performing some kind of compensation for those removed bits, such as adding a constant. Where truncation is used to optimize a node (in block 306), this truncation may be different to that used when allocating errors to the nodes (in block 304 using equation (4)).

Figure 6:
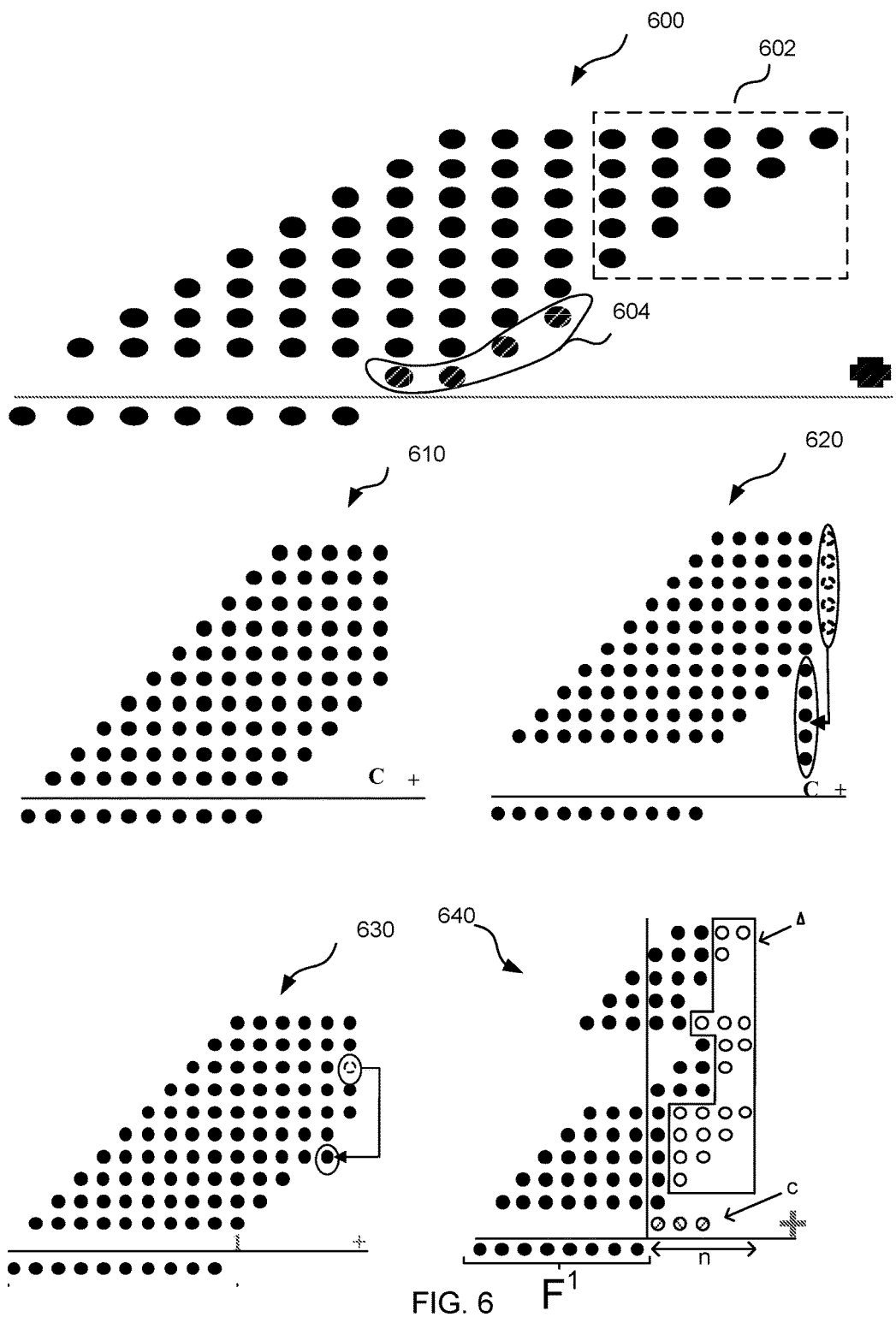
FIG. 6 shows examples of array truncation schemes.

This is shown graphically in FIG. 6 which shows a binary array 600 in which some of the least significant columns 602 are discarded and a constant 604 is added to compensate for the loss. Four particular truncation schemes are also shown graphically in FIG. 6: constant correction truncation (CCT) 610, variable correction truncation (VCT) 620, least mean square (LMS) 630 and a faithful rounding machine (FRator) 640. When using any of these schemes, the parameters used when removing bits and adding a constant (denoted C) must be selected to ensure faithful rounding. The first three of these schemes (CCT, VCT and LMS) work only when the operation is multiplication. The FRator truncation scheme works in any situation where there is a binary array.

In various examples, the FRator truncation scheme 640 (which is described in US Patent Application publication number US2013/0346927) is used. FRator, as described in the US Patent Application is a faithful rounding technique which removes the maximum number of bits such that the result is faithfully rounded. However, when used to optimize a node in a DFG (in block 306 of FIG. 3), it is modified so that it removes the maximum number of bits without exceeding the allocated error for that node (and hence generates an updated single summation array). As in other truncation schemes, a constant is added to compensate for the bits that have been removed. In the graphical representation 640 in FIG. 6, the bits which are removed are shown as empty circles and denoted $\Delta$ and the bits which are added as compensation (and form constant C) are shown as circles with striped shading.

For a constant division node, the node can similarly be optimized by removing the least significant bits from the single summation array such that their maximum associated binary value does not exceed:

$$(2u_i-1)2^{n_i} \quad (13)$$

As for SOP nodes, the optimization may involve using standard reduction techniques such that internal products will not exist during the reduction and any suitable truncation scheme may be used. The constant division operation may be expressed as a multiply-add instruction (as in the form set out in equation (1) above) or as an infinite set of copies of a binary array that sums to ax, each offset by a distance s (as in the form set out in equation (2) above).

In an example, the optimization of a constant division node may be performed by truncating an infinite array (which is represented in a finite way) and including a constant, as can be described with reference to FIGS. 9-12. Whilst the method described herein refers to creating and truncating an infinite array, it will be appreciated that a finite representation of the infinite array is actually formed (e.g. by reference to a repeating section).

Figure 9:
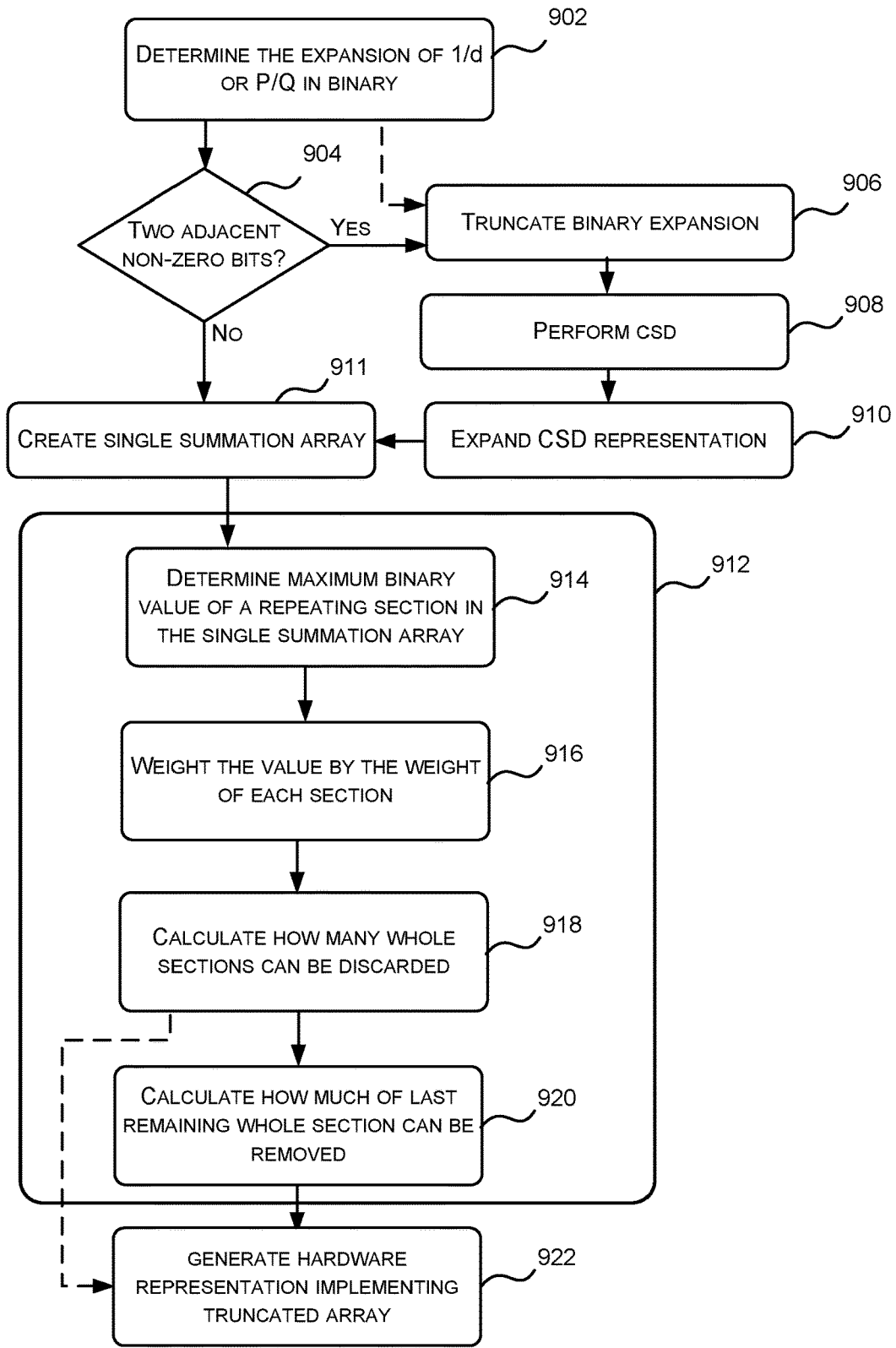
FIG. 9 is a flow diagram of an example method of optimizing a constant division.

As shown in FIG. 9, the method comprises generating (or taking as an input) the value of the constant division (e.g. 1/d) in binary (block 902). As described above with reference to equation (2), the constant division can be expressed as:

$$\frac{1}{d} = \frac{1}{2^r}\frac{a}{2^s-1} = \left(\frac{B}{2^s-1}\right) = B(2^{-s} + 2^{-2s} + \ldots) \quad (14)$$

where s is a positive integer and B is an integer in the range [0,$2^s$−2]. Depending upon the value of d (which is a positive, odd integer), 1/d is a recurring expansion 1004 with a repeating portion B, as shown graphically in the upper part of FIG. 10.

For example, if d=7, then 1/7 in binary is:
0.00100100100100100100100100100100100100100 1001001001001001 00 . . .
and it can be seen that after the radix point there is a repeating section '001':
0.001|001|001|. . .
Similarly for d=21, 1/21 in binary is:
0.000011000011000011000011000011000011000011000 011000011000011 00 . . .
and it can be seen that after the radix point there is a repeating section '000011':
0.000011|000011|000011|. . .
Similarly for d=49, 1/49 in binary is:
0.00000101001110010111100000101001110010111 1000 001010011100101 111 . . .
and it can be seen that after the radix point there is a repeating section '0000010100111 0010111':
0.0000010100111001 0111|0000010100111001 01111|. . .

A single summation array (which may also be referred to as a binary array) could then be formed using the binary representation of 1/d. A summation array for a node is an array formed from all of the partial products corresponding to the operator (e.g. a constant division or SOP operator), e.g. which implements equation (14) above. However, to reduce the size of the single summation array (which produces area, delay and power benefits in the resultant hardware) for binary representations comprising adjacent non-zero bits ('Yes' in block 904), the binary representation may first be converted into canonical signed digit representation (CSD) in which each bit can be a 1, 0 or −1 (shown as $\bar{1}$) and in which no two adjacent bits are non-zero (block 908). In the event that the binary representation does not comprise adjacent non-zero bits ('No' in block 904), the CSD conversion may be omitted because the CSD representation is the same as the binary representation. Alternatively, CSD may always be performed (as indicated by the dotted arrow from block 902 to block 906) and for binary representations (which may also be referred to as binary expansions) with no adjacent ones, the CSD operation (in block 908) will leave the representation unchanged.

The algorithms for converting a binary representation to CSD operate on a finite binary number and as described above, if d is an odd number, 1/d in binary is not terminating (and hence is not finite in terms of the number of bits required) but is instead a recurring expansion. Consequently, in the event that CSD is to be used (in block 908), the binary representation (from block 902) is first truncated (block 906) before the truncated binary representation is converted into CSD (in block 908).

Figure 10:
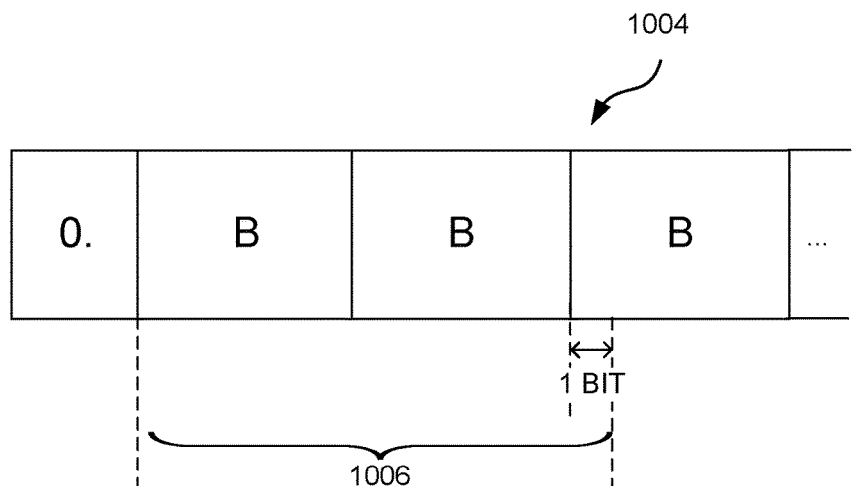
FIG. 10 is a graphical representation of elements of the method of FIG. 9.
Figure 10:
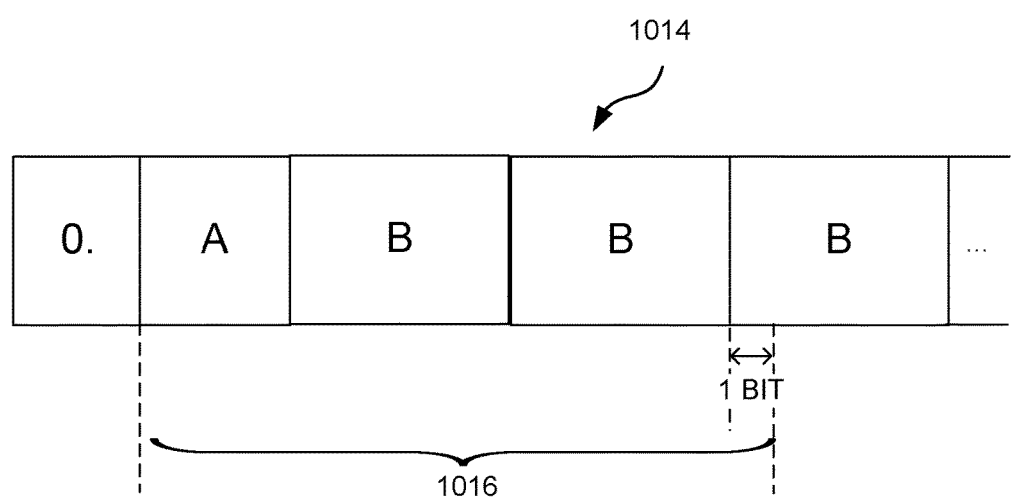

The truncation (in block 906) involves taking all the bits from a plurality of complete repeating sections (e.g. 2 repeating sections) and one extra bit from the next section (when working from left to right), as shown by bracket 1006 in FIG. 10. Referring to the examples above, the truncation may for example comprise, for d=21, truncating:
0.000011000011000011000011000011000011000011000 011000011000011 00 . . .
to be:
0.0000110000110
and for d=49, truncating:
0.0000010100111001011110000010100111001 0111100 0001010011100101 111 . . .
0.00000101001110010111100000101001110010111 10

Taking the example with d=21, if binary representation:
0.0000110000110
is converted into CSD notation, this becomes:
0.00010$\bar{1}$0001 0$\bar{1}$0
which has a repeating section: 00010$\bar{1}$ which is the same length as the repeating section prior to conversion into CSD notation.

Taking the example with d=49, if binary representation:
0.0000010100111001011110000010100111001011110
is converted into CSD notation, this becomes:
0.0000010101 00$\bar{1}$010$\bar{1}$000$\bar{1}$000001 010100$\bar{1}$010$\bar{1}$000$\bar{1}$0
which has a repeating section: 0000010101 00$\bar{1}$010$\bar{1}$000$\bar{1}$
which is again the same length as the repeating section prior to conversion into CSD notation.

Having converted the truncated representation into CSD (in block 908), the resulting CSD representation also comprises a recurring portion and this recurring portion is the same length (i.e. comprises the same number of bits) as the recurring portion in the binary representation, as shown in the examples above, and so the CSD representation can then be extended to form an infinite CSD representation by repeating this recurring portion (block 910).

Figure 11:
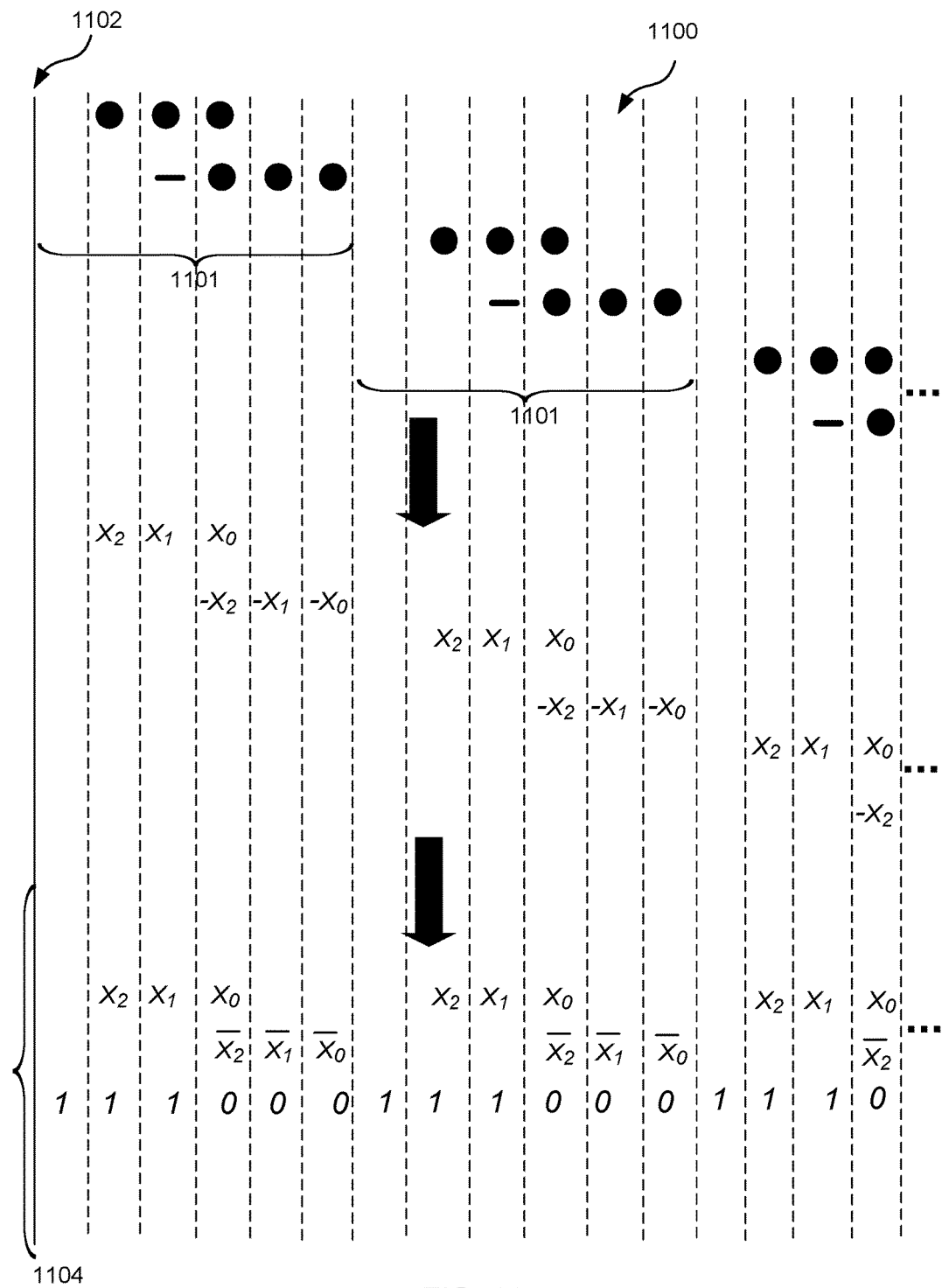
FIG. 11 is a further graphical representation of elements of the method of FIG. 9.

A single summation array is then created from the infinite CSD representation (block 911) and as the representation is infinite, the complete array is also infinite. This summation array (created in block 911) however, also comprises a repeating portion 1101 and the portion has a length of s bits (where this number of bits, s, is the same as the number of bits in the recurring sections in the CSD representation and the binary representation). Part of an example infinite array 1100 for d=21 and for an input value x between having 3 bits is shown in FIG. 11 and where the vertical line 1102 indicates the position of the radix point.

Consequently, the single summation array is truncated (block 912) before it is implemented in the hardware representation (block 922, e.g. by summing the bits in the different binary weighted columns in the truncated array). The constant, C, (as defined above) is added back into the array before producing the final truncated array (e.g. between block 912 and block 922 in FIG. 9). The formation of the array (in block 911) and the truncation of the array (in block 912) are described in more detail below. As described above, the hardware representation of the truncated array which is output by the method of FIG. 9 may be in the form of RTL (e.g. in VHDL), GDSII, etc. This hardware representation may then be implemented (i.e. fabricated) in hardware (e.g. in silicon) as part of a filter or other electronic circuit, e.g. a filter which is used in bilinear or trilinear filtering or other forms of image filtering.

As described above, the hardware representation of the truncated array which is output by the method of FIG. 9 may be in the form of RTL (e.g. in VHDL), GDSII, etc. This hardware representation may then be implemented (i.e. fabricated) in hardware (e.g. in silicon) as part of a filter or other electronic circuit, e.g. a filter which is used in bilinear or trilinear filtering or other forms of image filtering.

As part of the array formation (in block 911), all the negative bits (shown as $\bar{1}$ above) are transformed into inverted bits and a constant Z is added, since −x=$\bar{x}$+1. If for various i and j the value of the recurring bits to be negated is given by:

$$-\frac{1}{2^s-1}\sum_{j,k} 2^j x_k \qquad (15)$$

where j ranges from 0 to s−1, and k varies from 0 to n−1 but only some of these terms are present (depending on where negated bits of x are in the binary array).

The summation in equation (15) is the same as:

$$\frac{1}{2^s-1}\sum_{j,k} 2^j \overline{x_k} - \frac{1}{2^s-1}\sum_{j,k} 2^j$$

Therefore, all the negated bits in the array can be replaced with inverted bits and the following constant, Z, is computed and then added into the array (e.g. as shown in the final part 1104 of FIG. 11):

$$Z = -\frac{1}{2^s-1}\sum_{j,k} 2^j$$

For example, in the case of n being 3 and d=21 (s=6):

$$Z = -\frac{1}{63}\sum_{j=0...2} 2^j x_j = \frac{1}{63}\sum_{j=0...2} 2^j \overline{x_J} - \frac{7}{63}$$

So the constant, Z=−7/63=−1+56/63 would need adding into the array (56/63=0.111000111000111000 . . . and in twos complement notation, −1=. . . 111.000000 . . . ).

When truncating the array (in block 912), the maximum value of the repeated section is determined (block 914) and this enables the bounding of the error introduced by truncating the infinite array. As shown in the example in FIG. 11, there will be copies of $x_j$ and $\overline{x}_j$ in various columns so there exist positive integers $a_j$ and $b_j$ such that the value of the repeated section, D, can be expressed as follows:

$$D = \sum_{j=0}^{n-1}(a_j x_j + b_j \overline{x_J}) + K$$

$$= \sum_{j=0}^{n-1}(a_j x_j - b_j x_j) + \left(K + \sum_{j=0}^{n-1} b_j\right)$$

$$= \sum_{j=0}^{n-1}(a_j - b_j)x_j + \left(K + \sum_{j=0}^{n-1} b_j\right)$$

We can then separate out those terms when $a_j−b_j$ is negative and when it is positive (i.e. when $a_j>b_j$):

$$= \sum_{\substack{j=0 \\ a_j>b_j}}^{n-1} x_j(a_j-b_j) + \sum_{\substack{j=0 \\ a_j<=b_j}}^{n-1} x_j(a_j-b_j) + \left(K + \sum_{j=0}^{n-1} b_j\right)$$

The value $D_{max}$ can be calculated by noting that D is maximised by setting $x_j=1$ when $a_j>b_j$ and $x_j=0$ otherwise, hence:

$$D_{max} = \sum_{j=0,a_j>b_j}^{n-1}(a_j-b_j) + \left(K + \sum_{j=0}^{n-1} b_j\right) \quad (16)$$

The result, $D_{max}$, is then weighted by the weight of each section (block 916), where this weight is given by:

$$\frac{1}{2^s-1} \quad (17)$$

Using this, the number, r, of whole sections which are retained (block 918) is determined by finding the minimum value of r which satisfies:

$$\frac{D_{max} 2^{-rs}}{2^s-1} \leq (2u-1)2^p \quad (18)$$

The smallest such r is:

$$r_{min} = \left\lceil \frac{1}{s}\left(\left(\log_2 \frac{D_{max}}{(2^s-1)(2u-1)}\right) - p\right)\right\rceil \quad (19)$$

where the absolute error, |ε|, is:

$$|\varepsilon| \leq u 2^p$$

Referring to the example shown in FIG. 11 (for d=21, where s=6) and if u=1 and p=−6:

$$D = 2^0(\overline{x_0}) + 2^1 \overline{x_1} + 2^2(\overline{x_2}+x_0) + 2^3(x_1+1) + 2^4(x_2+1) + 2^5$$

$$D = (3x_0 + 6x_1 + 12x_2) + 63$$

So, using equation (16):

$$D_{max} = (3+6+12) + 63 = 84$$

And, using equation (19):

$$r_{min} = \left\lceil \frac{1}{6}\left(\left(\log_2 \frac{84}{(2^6-1)(2*1-1)}\right) + 6\right)\right\rceil = 2$$

And in this case $r_{min}=2$.

Having removed many of the whole sections (in block 918), the truncation may also discard one or more columns from the last remaining whole section (in block 920). The value that these discarded columns may contain must be less than or equal to:

$$(2u-1)2^p - \frac{D_{max} 2^{-r_{min} s}}{2^s-1} \quad (20)$$

If $D_j$ is the value of the least significant j columns of the repeating section, these values can be computed in a similar fashion to D (e.g. as described above). In the case of d=21 and referring to FIG. 11:

$$D_1 = \overline{x_0} = -x_0 + 1$$

$$D_2 = 2\overline{x_1} + \overline{x_0} = -(2x_1 + x_0) + 3$$

$$D_3 = 4x_0 + 4\overline{x_2} + 2\overline{x_1} + \overline{x_0} = (3x_0) - (4x_2 + 2x_1) + 7$$

$$D_4 = 8x_1 + 8 + 4x_0 + 4\overline{x_2} + 2\overline{x_1} + \overline{x_0} = (6x_1 + 3x_0) - (4x_2) + 15$$

$$D_5 = 16x_2 + 16 + 8x_1 + 8 + 4x_0 + 4\overline{x_2} + 2\overline{x_1} + \overline{x_0} = (12x_2 + 6x_1 + 3x_0) + 31$$

$$D_6 = 32 + 16x_2 + 16 + 8x_1 + 8 + 4x_0 + 4\overline{x_2} + 2\overline{x_1} + \overline{x_0} = (12x_2 + 6x_1 + 3x_0) + 63$$

The maximum values of these can be calculated in a similar fashion to $D_{max}$:

$D_{1,max}=1, D_{2,max}=3, D_{3,max}=3-0+7=10$ $D_{4,max}=(6+3)-0+15=24$ $D_{5,max}=(12+6+3)+31=52$ $D_{6,max}=D_{max}=(12+6+3)+63=84$ The number of additional columns to truncate having retained only r copies of repeated section is the largest j such that:

$$D_{j,max}2^{-r_{min}s} \le (2u-1)2^p - \frac{D_{max}2^{-r_{min}s}}{2^s-1}$$

$$D_{j,max} + \frac{D_{max}}{2^s-1} \le (2u-1)2^{p+r_{min}s}$$

In the case of d=21, s=6, $r_{min}$=2, $D_{max}$=84, u=1, p=−6:

$$D_{j,max} + \frac{84}{63} \le 2^6$$

In this case, the maximum j is 5 as 52+84/63≤64.

Having discarded none, one or more columns from the last whole section, in some examples none, one or more bits from the last remaining column may also be discarded if this is possible without violating the error bound.

The truncation (in block 912) may be described as "greedy eating" because bits are discarded starting at the least significant bits (LSBs) until the error bound is reached.

By using the method shown in FIG. 9 and described above, the resulting hardware is smaller and is guaranteed to meet the defined maximum error requirement.

Figure 12:
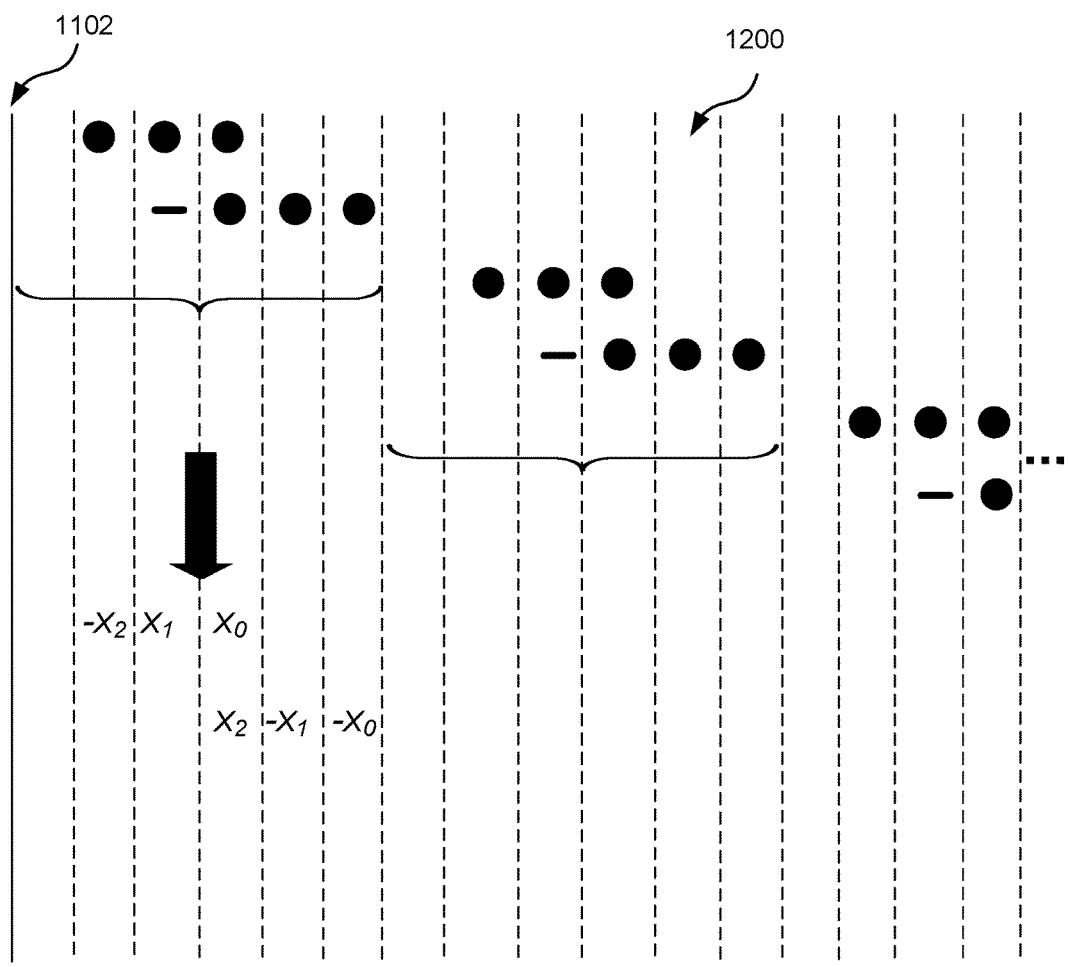
FIG. 12 is another graphical representation of elements of the method of FIG. 9.

In the examples described above, the input x (which is multiplied by the invariant rational, 1/d, in the hardware representation which is generated) is an unsigned number. The method may also be used where x is a signed number. The method operates as described above, with the only exception that a negative weight is applied to the most significant bit. This is shown in FIG. 12 which shows the same example as FIG. 11, except that the input number, x, is a signed twos complement input which can take negative numbers.

In the examples described above, the invariant rational has the form 1/d where d is an odd integer that is greater than one. The methods however may be used where the invariant rational has the form P/Q where P and Q are assumed to be coprime integers without loss of generality and Q is not a power of two. In such examples, equation (14) above is modified to be:

$$\frac{P}{Q} = \frac{1}{2^q}\left(A + \frac{B}{2^s-1}\right) \quad (21)$$

where A is a positive integer. P/Q is a recurring expansion 1014 with a repeating portion B, as shown graphically in the lower part of FIG. 10.

For example, if P=7 and Q=12, then 7/12 in binary is:
0.10010101010101010101010101010101010101
0101010101010101 01 . . .
and it can be seen that after the radix point there is a first 'A' section '10' followed by a repeating 'B' section '01':
0.10|01|01|. . .

Similarly for P=11, Q=12, then 11/12 in binary is:
0.1110101010101010101010101010101010101
1010101010101010 10 . . .
and it can be seen that after the radix point there is a first 'A' section '11' followed by a repeating 'B' section '10' (although, as shown by this example, the decomposition of P/Q into sections A and B is not unique; however, this does not affect the final result):
0.11|10|10|. . .

Similarly for P=7, Q=22, then 7/22 in binary is:
0.0101000101110100010111010001011101000101110 10
001011101000101 11 . . .
and it can be seen that after the radix point there is a first 'A' section '01' followed by a repeating 'B' section '0100010111':
0.01|0100010111|0100010111|. . .

Of these three examples, the first (P/Q=7/12) does not comprise two adjacent non-zero bits ('No' in block 904) so CSD (if used) would not change the representation, but the other two examples would result in a different CSD representation when converted into CSD (in blocks 906-910). For an invariant rational of the form P/Q, the truncation (in block 906) involves taking all the bits from the first 'A' section, all the bits from a plurality of complete repeating sections (e.g. 2 repeating sections) and one extra bit from the next section (when working from left to right), as shown by bracket 1016 in the lower part of FIG. 10.

Referring to the examples above, the truncation may for example comprise, for P=11, Q=12, truncating:
0.1110101010101010101010101010101010101010
1010101010101010 10 . . .
to be:
0.1110101
and for P=7, Q=22, truncating:
0.0101000101110100010111010001011101000101110 1
0001011101000101 11 . . .
to be:
0.01010001011101000101110

Taking the example with P=11, Q=12, if binary representation:
0.1110101
is converted into CSD notation, this becomes:
1.00$\bar{1}$0101
which has a first section 1.00$\bar{1}$0 followed by a repeating section 10. As shown in this example, the first 'B' section ($\bar{1}$0) may be altered by the presence of A (00 following the radix point) and is hence absorbed into the first section and it is the second copy of B (10) that is replicated after CSD is applied. As before, the number of bits in each section remain the same as before applying CSD (e.g. 2 bits in A after the radix point, 2 bits in the first B section and 2 bits in the next B section).

Taking the example with P=7, Q=22, if binary representation:
0.01010001011101000101110
is converted into CSD notation, this becomes:
0.0101001$\bar{1}$00$\bar{1}$010010$\bar{1}$00$\bar{1}$0
which has a first section 01010010$\bar{1}$00$\bar{1}$ (which is the combination of the A section and the first B section) followed by a repeating section 010010$\bar{1}$00$\bar{1}$ (which corresponds to the second B section).

The method then proceeds as described above with reference to FIG. 9, except that in the earlier equations q=0, so equations (18)-(20) become:

$$\frac{D_{max}2^{-sm-q}}{2^s-1} \le (2u-1)2^p \qquad (18')$$

$$r_{min} = \left\lceil \frac{1}{s}\left(\left(\log_2 \frac{D_{max}}{(2^s-1)(2u-1)}\right) - p - q\right)\right\rceil \qquad (19')$$

$$(2u-1)2^p - \frac{D_{max}2^{-r_{min}s-q}}{2^s-1} \qquad (20')$$

Furthermore, as noted above, due to the conversion into CSD representation, the first recurring B section may differ from the subsequent B sections. Consequently, when calculating $D_{max}$ (using equation (16)), this may be calculated for the repeated second B section and the combination of the A section and the first B section as a single special preamble.

When performing the truncation (in block 912), it is the repeating 'B' section which is considered (in blocks 914-918) and not the initial 'A' section. However, the initial 'A' block may, in some examples, be partially truncated (in block 920, e.g. where r=0 such that all the repeating B sections are discarded).

By using the methods described above (e.g. as shown in FIG. 3), a hardware representation of a binary logic circuit (e.g. in RTL) can be generated which occupies a smaller area when fabricated (e.g. a smaller area of silicon) but still guarantees to meet a defined error requirement (which may be faithful rounding of the result of the entire polynomial). As noted above, the hardware representation is generated using the optimized single summation array for each node in the DFG. The methods described above therefore aid miniaturization of components and the devices (e.g. smartphones, tablet computers and other computing devices) in which the components are used. In addition, or instead, it enables more functionality to be implemented within a similar area of silicon chip. By reducing the physical size (i.e. area) that is used, more ICs can be fabricated from a single silicon wafer, which reduces the overall cost per die.

In the methods described above (and shown in FIG. 3), the polynomial is represented as a DFG comprising only SOPs and constant divisions and input to the lossy synthesizer (in block 302). It will be appreciated that there may be many different architectures which could be used for a particular polynomial. These different architectures may lead to different RTL implementations for a polynomial being generated.

Figure 7:
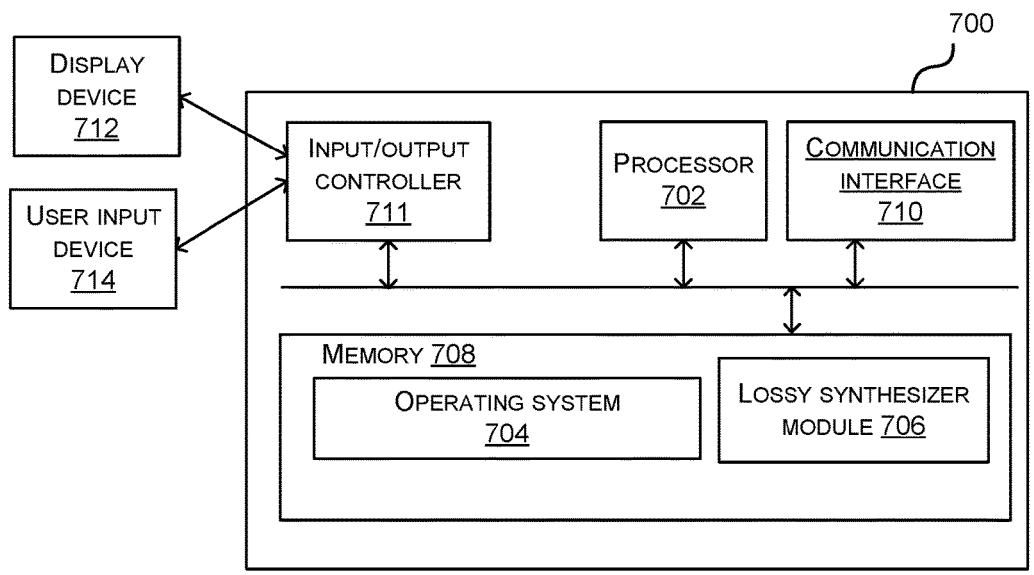
FIG. 7 is a schematic diagram of an example computing device which may be configured to implement the methods described herein.

FIG. 7 illustrates various components of an exemplary computing-based device 700 which may be implemented as any form of a computing and/or electronic device, and in which embodiments of the methods described herein may be implemented.

Computing-based device 700 comprises one or more processors 702 which may be microprocessors, controllers or any other suitable type of processors for processing computer executable instructions to control the operation of the device in order to perform the methods described herein (e.g. the method of FIG. 3). In some examples, for example where a system on a chip architecture is used, the processors 702 may include one or more fixed function blocks (also referred to as accelerators) which implement a part of the method of generating the hardware representation (e.g. RTL) for a polynomial in hardware (rather than software or firmware). Platform software comprising an operating system 704 or any other suitable platform software may be provided at the computing-based device to enable application software, such as a lossy synthesizer module 706 (which performs the method of FIG. 3) to be executed on the device.

The computer executable instructions may be provided using any computer-readable media that is accessible by computing based device 700. Computer-readable media may include, for example, computer storage media such as memory 708 and communications media. Computer storage media (i.e. non-transitory machine readable media), such as memory 708, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 708) is shown within the computing-based device 700 it will be appreciated that the storage may be distributed or located remotely and accessed via a network or other communication link (e.g. using communication interface 710).

The computing-based device 700 also comprises an input/output controller 711 arranged to output display information to a display device 712 which may be separate from or integral to the computing-based device 700. The display information may provide a graphical user interface. The input/output controller 711 is also arranged to receive and process input from one or more devices, such as a user input device 714 (e.g. a mouse or a keyboard). This user input may be used to specify maximum error bounds (e.g. for use in the method of FIG. 3). In an embodiment the display device 712 may also act as the user input device 714 if it is a touch sensitive display device. The input/output controller 711 may also output data to devices other than the display device, e.g. a locally connected printing device (not shown in FIG. 7).

The polynomials described herein may be embodied in hardware on an integrated circuit using the methods described above. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. A computer or computer system may comprise one or more processors. Those skilled in the art will realize that such processing capabilities are incorporated into many different devices and therefore the term 'computer' includes set top boxes, media players, digital radios, PCs, servers, mobile telephones, personal digital assistants and many other devices.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed in an integrated circuit manufacturing system configures the system to manufacture an apparatus configured to perform any of the methods described herein, or to manufacture a hardware representation of a polynomial. An integrated circuit definition dataset may be, for example, an integrated circuit description.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS (RTM) and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a hardware implementation of a fixed-point polynomial with rational coefficients that satisfies a defined error bound will now be described with respect to FIG. 8.

Figure 8:
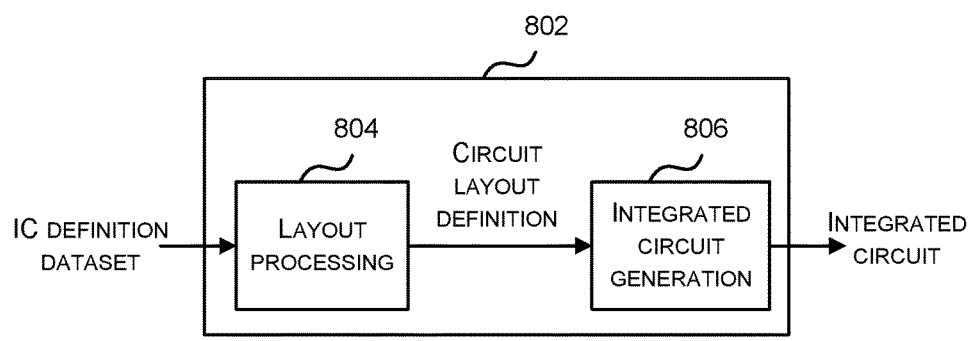
FIG. 8 shows an integrated circuit manufacturing system for generating an integrated circuit embodying a graphics processing system.

FIG. 8 shows an example of an integrated circuit (IC) manufacturing system 802 which comprises a layout processing system 804 and an integrated circuit generation system 806. The IC manufacturing system 802 is configured to receive an IC definition dataset (e.g. defining a hardware implementation of a fixed-point polynomial with rational coefficients that satisfies a defined error bound as described in any of the examples herein), process the IC definition dataset, and generate an IC according to the IC definition dataset (e.g. which embodies a hardware implementation of a fixed-point polynomial with rational coefficients that satisfies a defined error bound as described in any of the examples herein). The processing of the IC definition dataset configures the IC manufacturing system 802 to manufacture an integrated circuit embodying a hardware implementation of a fixed-point polynomial with rational coefficients that satisfies a defined error bound as described in any of the examples herein.

The layout processing system 804 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 804 has determined the circuit layout it may output a circuit layout definition to the IC generation system 806. A circuit layout definition may be, for example, a circuit layout description.

The IC generation system 806 generates an IC according to the circuit layout definition, as is known in the art. For example, the IC generation system 806 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 806 may be in the form of computer-readable code which the IC generation system 806 can use to form a suitable mask for use in generating an IC.

The different processes performed by the IC manufacturing system 802 may be implemented all in one location, e.g. by one party. Alternatively, the IC manufacturing system 802 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a hardware implementation of a fixed-point polynomial with rational coefficients that satisfies a defined error without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 8 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 8, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

The invention claimed is:

1. A method of fabricating an implementation of a fixed-point polynomial with rational coefficients in hardware logic that satisfies a defined error bound, the method comprising:
   receiving, in a synthesizer module, the polynomial as a data-flow graph comprising one or more nodes, wherein a node is either a sum-of-products operator or a constant division operator;
   computing, in the synthesizer module, a precision parameter and an accuracy parameter for each node in the data-flow graph based on the defined error bound for the polynomial by solving an optimization problem over all nodes;
   optimizing, in the synthesizer module, a single summation array for each node using a truncation scheme and an error bound for the node, wherein the error bound for the node is calculated using the precision parameter and the accuracy parameter for the node; and
   outputting, from the synthesizer module, a hardware representation of a binary logic circuit which implements the fixed-point polynomial, wherein the hardware representation is based on an optimized single summation array for each node.

2. The method according to claim 1, wherein the optimization problem is:

$$\min \Sigma_i P_i(k_i)$$

subject to:

$$\Delta_i(k_i) \leq (2u_i - 1)2^{n_i} \text{ for all } i$$

$$e_i = u_i 2^{n_i} \text{ for all } i$$

$$\Sigma_\alpha \lambda_\alpha e^\alpha \leq \eta$$

where: $P_i(k_i)$ is a function of a number of partial products that remain in a summation array for a node i after truncation, $\Delta_i(k_i)$ is a maximal value of a truncated section in the summation array for the node i, $e_i$ is the error bound for the node, $u_i$ is the accuracy parameter for the node i and $n_i$ is the precision parameter for the node i, $\eta$ is the defined error bound for the polynomial, $\lambda_\alpha = \max_x |c_\alpha(x)|$, $c_\alpha(x)$ is a polynomial in x, $e^\alpha$ is an error bound associated with a term in the polynomial $c_\alpha(x)$ and $\alpha$ is a vector of integers.

3. The method according to claim 2, wherein $P_i(k_i)$ is a number of bits that remain in a summation array for a node i after truncation.

4. The method according to claim 2, wherein for a sum-of-products node comprising M, m by m products:

$$P(k_i) = M(m_i^2 - \tfrac{1}{2}k_i(k_i+1))$$

and $$\Delta(k_i) = M\Sigma_{j=0}^{k-1}(j+1)2^j = M((k_i-1)2^{k_i}+1).$$

5. The method according to claim 2, wherein for a constant division node:

$$P(k_i) = \frac{m_i(m_i + 2k_i - 1)}{2d}$$

and $$\Delta(k_i) = \frac{m}{d 2^{k_i}}.$$

6. The method according to claim 2, wherein $P_i(k_i)$ is a function of a height and/or a width of a summation array for a node i after truncation.

7. The method according to claim 1, further comprising:
   inputting the hardware representation generated by the method of claim 1 to a logic synthesizer to produce a gate level description of the implementation of the fixed-point polynomial.

8. The method according to claim 1, further comprising:
   fabricating the hardware representation of a binary logic circuit which implements the fixed-point polynomial in hardware.

9. The method according to claim 8, wherein the hardware representation of a binary logic circuit which implements the fixed-point polynomial is fabricated in silicon.

10. A non-transitory computer readable storage medium having stored thereon computer executable instructions which, when executed by a processor, cause the processor to:
   receive a polynomial as a data-flow graph comprising one or more nodes, wherein a node is either a sum-of-products operator or a constant division operator;
   compute a precision parameter and an accuracy parameter for each node in the data-flow graph based on the defined error bound for the polynomial by solving an optimization problem over all nodes;
   optimize a single summation array for each node using a truncation scheme and an error bound for the node, wherein the error bound for the node is calculated using the precision parameter and the accuracy parameter for the node; and
   output a hardware representation of a binary logic circuit that implements the fixed-point polynomial, wherein the hardware representation is based on an optimized single summation array for each node.

11. An apparatus configured to perform lossy synthesis of a fixed-point polynomial with rational coefficients and to generate an implementation of a fixed-point polynomial with rational coefficients in hardware logic that satisfies a defined error bound, the apparatus comprising:
   a processor; and
   a memory comprising computer executable instructions which, when executed, cause the processor to:
   receive the polynomial as a data-flow graph comprising one or more nodes, wherein a node is either a sum-of-products operator or a constant division operator;
   compute a precision parameter and an accuracy parameter for each node in the data-flow graph based on the defined error bound for the polynomial by solving an optimization problem over all nodes;
   optimize a single summation array for each node using a truncation scheme and an error bound for the node, wherein the error bound for the node is calculated using the precision parameter and the accuracy parameter for the node; and
   output a hardware representation of a binary logic circuit which implements the fixed-point polynomial, wherein the hardware representation is based on an optimized single summation array for each node.

12. The apparatus according to claim 11, wherein the optimization problem is:

$$\min \Sigma_i P_i(k_i)$$

subject to:

$$\Delta_i(k_i) \leq (2u_i - 1)2^{n_i} \text{ for all } i$$

$$e_i = u_i 2^{n_i} \text{ for all } i$$

$$\Sigma_\alpha \lambda_\alpha e^\alpha \leq \eta$$

where: $P_i(k_i)$ is a function of a number of partial products that remain in a summation array for a node i after truncation, $\Delta_i(k_i)$ is a maximal value of a truncated section in the summation array for the node i, $e_i$ is the error bound for the node, $u_i$ is the accuracy parameter for the node i and $n_i$ is the precision parameter for the node i, $\eta$ is the defined error bound for the polynomial, $\lambda_\alpha = \max_x |c_\alpha(x)|$, $c_\alpha(x)$ is a polynomial in x, $e^\alpha$ is an error bound associated with a term in the polynomial $c_\alpha(x)$ and $\alpha$ is a vector of integers.

13. The apparatus according to claim 12, wherein $P_i(k_i)$ is a number of bits that remain in a summation array for a node i after truncation.

14. The apparatus according to claim 12, wherein for a sum-of-products node comprising M, m by m products:

$$P(k_i) = M(m_i^2 - \tfrac{1}{2}k_i(k_i+1))$$

and $$\Delta(k_i) = M\Sigma_{j=0}^{k-1}(j+1)2^j = M((k_i-1)2^{k_i}+1).$$

15. The apparatus according to claim 12, wherein for a constant division node:

$$P(k_i) = \frac{m_i(m_i + 2k_i - 1)}{2d}$$

and $$\Delta(k_i) = \frac{m}{d 2^{k_i}}.$$

16. The apparatus according to claim 12, wherein $P_i(k_i)$ is a function of a height and/or a width of a summation array for a node i after truncation.

17. The apparatus according to claim 11, further comprising:
a logic synthesizer arranged to receive the output hardware representation of a binary logic circuit which implements the fixed-point polynomial and to produce a gate level description of the implementation of the fixed-point polynomial.

18. The apparatus according to claim 11, further comprising:
an integrated circuit generation system arranged to fabricate the hardware representation of a binary logic circuit which implements the fixed-point polynomial in hardware.

19. The apparatus according to claim 18, wherein the hardware representation of a binary logic circuit which implements the fixed-point polynomial is fabricated in silicon.

* * * * *